United States Patent
Park et al.

(10) Patent No.: US 8,519,087 B2
(45) Date of Patent: Aug. 27, 2013

(54) BENZOBIS(THIADIAZOLE)-BASED ALTERNATING COPOLYMER AND PREPARATION THEREOF

(75) Inventors: Jea Gun Park, Gyeonggi-do (KR); Kwang-sup Lee, Daejeon (KR); Tae-dong Kim, Daejeon (KR); Heong Sub Oh, Daejeon (KR)

(73) Assignees: IUCF-HYU (Industry-University Cooperation Foundation Hanyang University), Seoul (KR); Hannam University Institute-Academia Corporation, Daejeon (KR)

( * ) Notice: Subject to any disclaimer, the term of this patent is extended or adjusted under 35 U.S.C. 154(b) by 113 days.

(21) Appl. No.: 13/295,434

(22) Filed: Nov. 14, 2011

(65) Prior Publication Data

US 2012/0302712 A1    Nov. 29, 2012

(30) Foreign Application Priority Data

May 27, 2011   (KR) .................. 10-2011-0050893

(51) Int. Cl.
   *C08G 63/02*    (2006.01)
   *C08G 64/00*    (2006.01)
(52) U.S. Cl.
   USPC ........................................................ 528/377
(58) Field of Classification Search
   USPC .................. 514/265.1; 528/377; 544/280
   See application file for complete search history.

(56) References Cited

PUBLICATIONS

Brown, A. R. et al., *A Universal Relation Between Conductivity and Field-Effect Mobility in Doped Amorphous Organic Semiconductors*, Synthetic Metals 68 (1994) 65-70.
Tsao, H. N. et al., *The Influence of Morphology on High-Performance. Polymer Field-Effect Transistors*, Adv. Mater. 21 (2009) 209-212.

*Primary Examiner* — Terressa Boykin
(74) *Attorney, Agent, or Firm* — Alston & Bird LLP (57) ABSTRACT

Disclosed are a benzobis(thiadiazole)-based alternating copolymer, a method for preparing the same, and an organic electronic device including the same.
The present disclosure provides a benzobis(thiadiazole)-based alternating copolymer represented by the chemical formula 1:

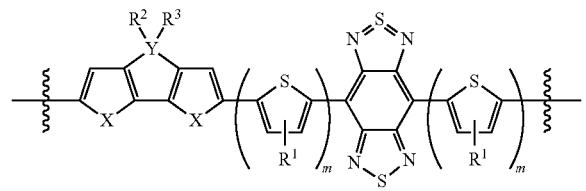

(1)

wherein $R^1$, $R^2$ or $R^3$ is hydrogen or $C_1$-$C_{20}$ linear, branched or cyclic alkyl, X is S, O, $NR^4$, $PR^5$, or HC=CH, wherein $R^4$ or $R^5$ is $C_1$-$C_{20}$ linear, branched or cyclic alkyl, Y is C, Si or N (in this case only one of $R^2$ and $R^3$ exists), and m is an integer from 1 to 3.

15 Claims, 3 Drawing Sheets

BENZOBIS(THIADIAZOLE)-BASED ALTERNATING COPOLYMER AND PREPARATION THEREOF

CROSS-REFERENCE TO RELATED APPLICATIONS

This application claims priority under 35 U.S.C. §119 to Korean Patent Application No. 10-2011-0050893, filed on May 27, 2011, in the Korean Intellectual Property Office, the disclosure of which is incorporated herein by reference in its entirety.

TECHNICAL FIELD

The present disclosure relates to a benzobis(thiadiazole)-based alternating copolymer, a method for preparing the same, and an organic electronic device including the same.

BACKGROUND

In the last decade, developments of organic materials having semiconductor properties and applications thereof have been studied actively. The scope of applications of organic semiconductors is extending consistently, including electromagnetic shielding films, capacitors, organic electroluminescent (EL) displays, organic thin-film transistors, solar cells, memory devices based on multiphoton absorption, or the like. Since first studied in 1980, the organic transistors are actively researched recently over the world. Since it is expected that electronic circuit substrates characterized by easy fabrication, low cost, good impact resistance and bendability or foldability will be essential in the future industry, the development of organic transistors capable of meeting these requirements is emerging as a very task.

Although the existing inorganic-based semiconductor materials ensure superior properties and reliabilities, the trend is shifting toward organic semiconductor materials because of difficulty in device fabrication. When compared with the inorganic semiconductor materials, the organic semiconductor materials allow easy device fabrication at low cost and achievement of superior properties through simple modification of structure.

Common organic semiconductor materials exhibit a big difference in the mobility of holes and electrons. It is known that, in most cases, the hole mobility is 10 to 1000 times higher than the electron mobility.

For an organic semiconductor material to be applicable to a transistor, it should have a charge mobility high enough to exhibit the device performance. One way of increasing the charge mobility is doping. Brown et al. of Philips have doped the organic semiconductors tetrathiafulvalene (THF) and 2,3-dichloro-5,6-dicyano-1,4-benzoquinone (DDQ) with tetracyanoquinodimethane (TCNQ) and poly(β'-dodecyl-oxy(-α, α'-α',α''-)terthienyl) (polyDOT$_3$), respectively, at various molar ratios and investigated the mobility. As a result, it was found out that, although the charge mobility increases with the doping concentration, the on/off ratio decreases due to the increase in conductivity (A. R. Brown, D. M. de Leeuw, E. E. Havinga, and A. Pomp, *Syn. Met.*, 68, 65, 1994). Accordingly, development of an organic field-effect transistor having a molecular system is necessary wherein the mobility increases more than the charge concentration does upon doping.

Meanwhile, there have been efforts to use a combination of a single molecule material and a polymer as an organic semiconductor. However, the performance of the polymer organic semiconductor is lower than that of the single molecule organic semiconductor. This may be because the film formation should be carried out in solution due to the large molecular weight of the polymer material, as reflected by the poor performance of a device fabricated in solution as compared to one fabricated by deposition of organic single molecules.

Studies have been made on copolymers having various repeat units. In particular, attempts have been made to develop new materials capable of reducing the energy band gap between the highest occupied molecular orbital (HOMO) and the lowest unoccupied molecular orbital (LUMO) for use as organic electronic materials such as organic semiconductors. Specifically, donor-acceptor (D-A) alternating conjugated polymers, which possess high light-harvesting aptitudes and ambipolar charge transporting abilities, have attracted special interests. For instance, a copolymer with alternating electron-deficient acceptor benzothiadiazole (BTD) and electron-donating cyclopentadithiophene exhibited hole mobilities of up to 1.4 cm$^2$/(V·s) in organic field-effect transistors (H. N. Tsao, et al., *Adv. Mater.*, 2009, 21, 209).

Benzobis(thiadiazole) (BBT) is also a potent electron acceptor and polymer organic electronic materials including the same as part of repeat units are studied.

SUMMARY

The present disclosure is directed to providing a new organic polymer material that can be utilized as an organic electronic material, for example, in an organic field-effect transistor. In particular, the present disclosure is directed to providing a new organic polymer electronic material including benzobis(thiadiazole), which has not been studied actively as yet but is known as a potent electron acceptor and is expected to reduce band gap, as part of repeat units.

In one general aspect, the present disclosure provides a benzobis(thiadiazole)-based, electron donor-acceptor type alternating copolymer.

The electron donor may include cyclopentadithiophene, fluorine, cyclopentadifuran, cyclopentadipyrrole or cyclopentadiphosphole derivatives, and the electron acceptor may include benzobis(thiadiazole) derivatives. Specifically, the benzobis(thiadiazole) derivative may include a thienyl-substituted derivative.

Specifically, the present disclosure provides a benzobis(thiadiazole)-based alternating copolymer represented by the chemical formula 1:

(1)

wherein R$^1$, R$^2$ or R$^3$ is hydrogen or C$_1$-C$_{20}$ linear, branched or cyclic alkyl, X is S, O, NR$^4$, PR$^5$, or HC=CH, wherein R$^4$ or R$^5$ is C$_1$-C$_{20}$ linear, branched or cyclic alkyl, Y is C, Si or N (in this case only one of R$^2$ and R$^3$ exists), and m is an integer from 1 to 3.

Other features and aspects will be apparent from the following detailed description, the drawings, and the claims.

BRIEF DESCRIPTION OF THE DRAWINGS

The above and other objects, features and advantages of the present disclosure will become apparent from the following description of certain exemplary embodiments given in conjunction with the accompanying drawings, in which.

DETAILED DESCRIPTION OF EMBODIMENTS

The advantages, features and aspects of the present disclosure will become apparent from the following description of the embodiments with reference to the accompanying drawings, which is set forth hereinafter. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The terminology used herein is for the purpose of describing particular embodiments only and is not intended to be limiting of the example embodiments. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments will be described in detail with reference to the accompanying drawings.

The present disclosure provides a benzobis(thiadiazole)-based alternating copolymer represented by the chemical formula 1:

(1)

wherein $R^1$, $R^2$ or $R^3$ is hydrogen or $C_1$-$C_{20}$ linear, branched or cyclic alkyl, X is S, O, $NR^4$, $PR^5$, or HC=CH, wherein $R^4$ or $R^5$ is $C_1$-$C_{20}$ linear, branched or cyclic alkyl, Y is C, Si or N (in this case only one of $R^2$ and $R^3$ exists), and m is an integer from 1 to 3.

The alternating copolymer represented by the chemical formula 1 according to the present disclosure is prepared from alternating copolymerization of a compound represented by the chemical formula 2 as an electron donor unit and a compound represented by the chemical formula 3 as an electron acceptor unit, as shown in Scheme 1.

The alternating copolymer represented by the chemical formula 1 may be prepared according to various methods, typically by Stille coupling or Suzuki coupling.

In Scheme 1, X, Y, m and $R^1$ are the same as defined in the chemical formula 1.

When the alternating copolymerization is performed by Stille coupling, $P^1$ may be $Sn(R^6)_3$, wherein $R^6$ is $C_1$-$C_3$ linear, branched or cyclic alkyl, and $P^2$ may be F, Cl, Br or I. The Stille coupling reaction occurs in the presence of a transition metal catalyst with a ligand attached thereto. Examples of the ligand-bound transition metal catalyst include $Pd(PPh_3)_4$, $Pd(PPh_3)_2Cl_2$, $Pd_2(dba)_3$, etc. Usually, the catalyst is prepared in situ from a reaction of a palladium precursor with $PPh_3$. The reaction is performed usually by reflux using an organic solvent such as DMSO, DMF, $CH_2Cl_2$, THF, hexane, ethyl acetate, diethyl ether, benzene, toluene, xylene, etc. Specifically, the reaction may be performed under inert gas atmosphere, and the reaction solvent may be dehydrated one.

When the alternating copolymerization is performed by Suzuki coupling, $P^1$ may be $B(OR^7)(OR^8)$, wherein $R^7$ and $R^8$ are $C_1$-$C_8$ linear, branched or cyclic alkyl or $R^7$ and $R^8$ are linked to form $(CR^9R^{10})_k$, wherein $R^9$ and $R^{16}$ are $C_1$-$C_8$ linear, branched or cyclic alkyl and k is an integer from 2 to 4, and $P^2$ may be F, Cl, Br or I. The Suzuki coupling reaction occurs in the presence of a transition metal catalyst with a ligand attached thereto. Examples of the ligand-bound transition metal catalyst include $Pd(PPh_3)_4$, $Pd(OAc)_2$, $Pd_2(dba)_3$, etc. Usually, the catalyst is prepared in situ from a reaction of a palladium precursor with $PPh_3$. The reaction is performed usually by reflux using an organic solvent such as DMSO, DMF, $CH_2Cl_2$, THF, hexane, ethyl acetate, diethyl ether, benzene, toluene, xylene, etc. Specifically, the reaction may be performed under inert gas atmosphere, and the reaction solvent may be dehydrated one. In general, an inorganic base such as $K_2CO_3$, $Na_2CO_3$, $CaCO_3$, NaOH, $Ca(OH)_2$, etc. is used together in the Suzuki coupling reaction.

When Stille coupling is employed, the compound of the chemical formula 2 may be prepared according to Scheme 2:

[Scheme 2]

4 (Y = $CH_2$, $SiH_2$ or NH)

4 (Y = $CR^2R^3$, $SiR^2R^3$ or $NR^2$)

2 (Y = $CR^2R^3$, $SiR^2R^3$ or $NR^2$; $P^1$ = $Sn(R^6)_3$)

Referring to Scheme 2, the compound of the chemical formula 2 may be prepared from the compound of the chemical formula 4 via a two-step process. In Scheme 2, X, $R^2$, $R^3$ and $R^6$ are the same as defined in the chemical formula 1 and Scheme 1.

In the first step, the compound of the chemical formula 4 is alkylated by reaction with an alkyl halide in the presence of a base. That is to say, the compound of the chemical formula 4 may be reaction with an alkyl halide in the presence of a base to prepare the compound of the chemical formula 3. Through control of the amount of the alkyl halide, a compound having one or two alkyl groups can be prepared selectively. Also, compounds having different alkyl groups can be prepared through sequential alkylation. The base may be an inorganic base such as sodium hydroxide, potassium hydroxide, calcium hydroxide, an alkyllithium such as butyllithium, NaH, etc. The reaction may be performed using an organic solvent such as DMSO, DMF, $CH_2Cl_2$, THF, hexane, ethyl acetate, diethyl ether, benzene, toluene, xylene, etc. at normal temperatures from −10 to 40° C. Specifically, the reaction may be performed under inert gas atmosphere, and the reaction solvent may be dehydrated one.

In the second step, the compound of the chemical formula 3 is reacted with a trialkyltin halide in the presence of a strong base to prepare the compound of the chemical formula 2. The strong base may be an alkyllithium such as butyllithium, NaH, or the like. Representative examples of the trialkyltin halide include $Me_3SnCl$, $Bu_3SnCl$, etc. The reaction may be performed using an organic solvent such as DMSO, DMF, $CH_2Cl_2$, THF, hexane, ethyl acetate, diethyl ether, benzene, toluene, xylene, etc. at low temperatures from −100 to 0° C. Specifically, the reaction may be performed under inert gas atmosphere, and the reaction solvent may be dehydrated one.

When Suzuki coupling is employed, the compound of the chemical formula 2 may be prepared according to Scheme 3:

[Scheme 3]

($P^2$ = $B(OR^7)(OR^8)$)
2

Referring to Scheme 3, the compound of the chemical formula 2 may be prepared from the compound of the chemical formula 5 via a one-step process. In Scheme 3, X, Y, $R^2$, $R^7$ and $R^8$ are the same as defined in the chemical formula 1 and Scheme 1.

The compound of the chemical formula 5 may be purchased commercially or prepared directly. The compound of the chemical formula 5 may be reacted with an alcohol, an alcohol mixture or a glycol.

The alcohol may be a $C_1$-$C_8$ linear, branched or cyclic alcohol, and two or more different alcohols may be used. The glycol may be one capable of forming $(CR^9R^{10})_k$, wherein $R^9$ and $R^{10}$ are $C_1$-$C_8$ linear, branched or cyclic alkyl and k is an integer from 2 to 4, as $R^7$ and $R^8$ are linked to each other.

Specifically, ethylene glycol, propylene glycol, pinacol, etc. may be used.

The reaction may be performed by reflux using an organic solvent such as DMSO, DMF, $CH_2Cl_2$, THF, hexane, ethyl acetate, diethyl ether, benzene, toluene, xylene, etc. The reaction temperature may range from 30 to 200° C. depending on the used solvent, and the reaction may be performed under inert gas atmosphere. Specifically, the reaction solvent may be dehydrated one.

The derivative of the chemical formula 3 in Scheme 1 may be prepared according to Scheme 4:

[Scheme 4]

The substitution of benzothiadiazole of the chemical formula 12 with halide is a well-known reaction. It can be easily achieved using an N-halosuccinimide reagent such as N-bromosuccinimide (NBS) or N-chlorosuccinimide (NCS) or a compound for halide substitution such as $Br_2$+HBr or $Cl_2$+HCl. The halide-substituted compound of the chemical formula 11 may be prepared into the compound of the chemical formula 10 through dinitration. The dinitration reaction may be carried out under a known nitration condition. Typically, the reaction may be performed by adding a mixture of sulfuric acid and nitric acid.

The compound of the chemical formula 10 may be reacted with the compound of the chemical formula 13 to prepare the compound of the chemical formula 8. The compound of the chemical formula 13 may be prepared by adding a trialkyltin halide compound to the oligoalkyl thiophene of the chemical formula 14 under a strong base condition. A representative example of the trialkyltin halide is tributyltin chloride. The alkyl group of the trialkyltin halide may be $C_1$-$C_8$ linear, branched or cyclic alkyl.

Subsequently, the nitro groups of the compound of the chemical formula 8 are reduced to amine groups to prepare the compound of the chemical formula 7. For the reduction of the nitro groups to amine groups, any known reducing agent, e.g. a transition metal catalyst in the presence of hydrogen, may be used. For selective reduction, a transition metal and an acid may be used. The transition metal may be Fe, Co, Ni, Pt, etc., and the acid may be an organic acid such as acetic acid, propionic acid, butanoic acid, oxalic acid, malonic acid, succinic acid, etc. or an inorganic acid such as hydrochloric acid, sulfuric acid, nitric acid, etc.

Then, the compound of the chemical formula 7 is cyclized to prepare the benzobis(thiadiazole) derivative compound of the chemical formula 3. The cyclization may be achieved by using, for example, N-thionylaniline.

EXAMPLES

The examples and experiments will now be described. The following examples and experiments are for illustrative purposes only and not intended to limit the scope of this disclosure.

The apparatuses and conditions used in the following preparation examples, examples and test examples are as follows.

$^1$H NMR: Unless specified otherwise, the Varian Inova-500 instrument (500 MHz) was used.

UV/vis spectral analysis for optical characterization: The Shimadzu spectrometer model NIR 3101 was used.

GPC analysis for measurement of average molecular weight: Viscotek's GPC Max (equipped with a pair of Olexis columns (Polymer Laboratires, Varian Inc.) and the TDA302 tetradetector array system with refractive index, UV, viscosity, and low and right angle light scattering modules; THF was used as eluent at 30° C.; calibrated with 10 polystyrene standards from 1.2×10$^6$ to 500 g/mol) was used.

Thermal stability measurement (thermal degradation temperature): The Netzsch Thermisch analyzer TG 209 was used.

Thermogravimetric analysis (TGA): Conducted in nitrogen flow of 15 mL/min from room temperature to 300° C. at a rate of 20° C./min.

Differential scanning calorimetry (DSC): Netzsch DSC 204 F1 was used (All samples were heated under nitrogen atmosphere from room 20° C. to 250° C. at a rate of 10° C./min.).

Electrochemical characterization: The potentiostat/galvanostat PAR 273A was used (working electrode: Pt; reference electrode: Ag/Ag$^+$ in acetonitrile; counter electrode: Pt; electrolyte: 0.1 M tetrabutylammonium hexafluorophosphate in acetonitrile; scan rate: 50 mV/s).

Preparation Example 1

Preparation of Cyclopentathiophene Derivatives as Electron Donor

Preparation of 4,4-bis(2-ethylhexyl)-4H-cyclopenta [2,1-b:3,4-b']dithiophene

[Scheme 5]

Cyclopentaditiophene (3 g, 16.8 mmol), 2-ethylhexyl bromide (6.3 mL, 35.3 mmol) and sodium iodide (252 mg, 1.68 mmol) were dissolved in DMSO (100 mL) and potassium hydroxide (3.77 g, 67.2 mmol) was added at room temperature under nitrogen flow. After stirring at room temperature for 17 hours, followed by extraction with distilled water and dichloromethane, the resultant was dried with MgSO$_4$ and filtered under reduced pressure. The final product 4,4-bis(2-ethylhexyl)-4H-cyclopenta[2,1-b:3,4-b']dithiophene (5.3 g, yield: 78%) was obtained by column chromatography (hexane). $^1$H NMR (300 MHz, CDCl$_3$, ppm): δ 7.11 (d, 2H), 6.96-6.90 (m, 2H), 1.96-1.79 (m, 4H), 1.07-0.83 (m, 18H), 0.75 (t, 6H), 0.59 (t, 6H).

Preparation of 4,4-bis(2-ethylhexyl)-2,6-bis(trimethylstannyl)-4H-cyclopenta[2,1-b:3,4-b']dithiophene

[Scheme 6]

The 4,4-bis(2-ethylhexyl)-4H-cyclopenta[2,1-b:3,4-b'] dithiophene (3.0 g, 7.45 mmol) prepared above was dissolved in anhydrous THF (20 mL) and kept at −78° C. under nitrogen flow. Then, n-BuLi (19 mL, 29.8 mmol, 2.5 M in hexane) was slowly added over 30 minutes. Subsequently, after stirring at −78° C. for 1 hour, tributyltin chloride (7.4 g, 37.1 mmol) was added and reaction was performed at room temperature for 17 hours. The resulting product was extracted with ether and distilled water, dried with anhydrous MgSO$_4$ and filtered under reduced pressure. The final product 4,4-bis(2-ethylhexyl)-2,6-bis(trimethylstannyl)-4H-cyclopenta[2,1-b:3,4-b']dithiophene (5.1 g, yield: 94%) was obtained by column chromatography (neutral alumina, n-hexane). $^1$H NMR (300 MHz, CDCl$_3$, ppm): δ 7.01-6.88 (m, 2H), 1.93-1.76 (m, 4H), 1.04-0.81 (m, 18H), 0.74 (t, 6H), 0.59 (t, 6H), 0.49-0.22 (m, 18H).

Preparation Example 2

Preparation of Fluorene Derivative as Electron Acceptor

Preparation of 2,7-bis(4,4,5,5,-tetramethyl[1.3.2]dioxaborolan-2-yl)-9,9-bis(2-ethylhexyl)-fluorene

[Scheme 7]

Pinacol (0.43 g, 3.66 mmol) and 9,9-di(2'-ethylhexyl)fluorene-2,7-diboronic acid (0.5 g, 1.05 mmol) were dissolved in anhydrous toluene (30 mL) and, after heating to 80° C., the mixture was stirred for 4 hours. After the reaction was terminated, the produced compound was extracted with distilled water and dichloromethane, dried with anhydrous MgSO$_4$ and filtered under reduced pressure. The final product 2,7-bis(4,4,5,5,-tetramethyl[1.3.2]dioxaborolan-2-yl)-9,9-bis(2-ethylhexyl)-fluorene (0.28 g, yield: 37.7%) was obtained by column chromatography (n-hexane:dichloromethane=3:1). $^1$H NMR (300 MHz, CDCl$_3$, ppm): δ 7.84-7.69 (m, 6H), 2.00 (d, J=5.3 Hz, 4H), 1.36 (s, 24H), 0.86-0.50 (m, 22H), 0.48-0.45 (m, 8H).

Preparation Example 3

Preparation of Benzobis(Thiadiazole) Derivatives as Electron Acceptor

Preparation of 4,7-dibromobenzothiadiazole

[Scheme 8]

Benzothiadiazole (5 g, 23.0 mmol) was dissolved in HBr (75 mL, 48%) and slowly added to a solution of bromine (17.7 g, 110.6 mmol) in HBr (16.2 mL, 48%) under nitrogen flow. Then, after heating to 120° C. and stirring for 6 hours, the reaction was terminated. After cooling to room temperature, bromine remaining in the product was removed by adding aqueous NaHSO$_3$ solution and stirring for 30 minutes. After extraction with dichloromethane, the product was dried with anhydrous MgSO$_4$ and filtered under reduced pressure. The final product 4,7-dibromobenzothiadiazole (6.4 g, yield: 95%) was obtained by recrystallization using dichloromethane. $^1$H NMR (300 MHz, CDCl$_3$/DMSO, ppm): δ 7.73 (s, 2H).

Preparation of 1,4-dibromo-5,6-dinitro-benzothiadiazole

[Scheme 9]

Sulfuric acid (100 mL) and nitric acid (100 mL) were cooled to 0° C. 1,4-Dibromo-2,1,3-benzothiadiazole (5.22 g, 17.8 mmol) was slowly added while maintaining the temperature. The reactants were stirred at 0° C. for 6 hours. After adding icy water (300 mL), the resulting precipitate was under reduced pressure.

Preparation of tributyl-2-thienylstannane

[Scheme 10]

Thiophene (2.0 g, 12 mmol) was dissolved in anhydrous THF (20 mL) and n-BuLi (9.52 mL, 23.8 mmol, 2.5 M in hexane) slowly added at −30° C. under nitrogen flow. After stirring for 1 hour, tributyltin chloride (7.75 mL, 23.8 mmol) was added. After heating to room temperature, followed by stirring for 3 hours, the reaction was terminated. The produced compound was extracted with n-hexane and distilled water, dried with anhydrous MgSO$_4$ and filtered under reduced pressure. The final product tributyl-2-thienylstannane (2.5 g, yield: 46%) was obtained by column chromatography (neutral alumina, n-hexane). The product was used in the next step after removing the solvent.

Preparation of 1,4-di(2-thienyl)-5,6-dinitro-2,1,3-benzothiadiazole

[Scheme 11]

2-Tributylstannylthiophene (9.06 g, 24.3 mmol) and 1,4-dibromo-5,6-dinitro-2,1,3-benzothiadiazole (3.80 g, 9.90 mmol) were dissolved in anhydrous THF (150 mL). After adding Pd(PPh$_3$)$_2$Cl$_2$ (338 mg, 0.48 mmol), reflux was performed for 16 hours. After the reaction was terminated, the temperature was raised to room temperature and the solvent was removed. The product was extracted with dichloromethane and distilled water, dried, subjected to column chromatography (neutral alumina, hexane) and recrystallized in toluene to obtain yellow solid. $^1$H NMR (500 MHz, CDCl$_3$, ppm): δ 7.75 (dd, 2H, J=5.0 Hz, J=1.0 Hz), 7.52 (dd, 2H, J=3.5 Hz, J=1.0 Hz), 7.24 (dd, 2H, J=5.0 Hz, J=3.5 Hz).

Preparation of 1,4-di(2-thienyl)-5,6-diamino-2,1,3-benzothiadiazole

[Scheme 12]

The 1,4-di(2-thienyl)-5,6-dinitro-2,1,3-benzothiadiazole (502 mg, 1.29 mmol) synthesized above was added to acetic acid (40 mL) together with iron dust (878 mg, 15.72 mmol) and reacted at 90° C. for 24 hours. The resulting solution was poured to distilled water and extracted with ether. The organic solvent layer was dried to obtain 1,4-di(2-thienyl)-5,6-diamino-2,1,3-benzothiadiazole (410 mg, 1.24 mmol, yield: 96%) as yellowish brown solid. $^1$H NMR (400 MHz, CDCl$_3$, ppm): δ 7.56 (dd, 2H, J=5.5 Hz, J=1.1 Hz), 7.38 (dd, 2H, J=3.3 Hz, J=1.1 Hz), 7.26 (t, 2H, J=4.7 Hz), 4.38 (br, 4H).

Preparation of 4,7-bis(5-bromo-2-thienyl)-2,1,3-benzothiadiazole-5,6-diamine

[Scheme 13]

The 1,4-di(2-thienyl)-5,6-diamino-2,1,3-benzothiadiazole (459 mg, 1.39 mmol) synthesized above was dissolved in THF (20 mL) and NBS (497 mg, 2.80 mmol) was added at 90° C. After reaction for 4 hours, NBS (54 mg, 0.3 mmol) was further added and reaction was further performed for 2 hours. The resulting solution was poured to distilled water, extracted with CHCl$_3$ (4×100 mL) and dried with Na$_2$SO$_4$. After removing the solvent, 4,7-bis(5-bromo-2-thienyl)-2,1,3-benzothiadiazole-5,6-diamine (411 mg, 0.84 mmol, yield: 61%) was obtained by column chromatography (CHCl$_3$) as green solid. $^1$H NMR (400 MHz, CDCl$_3$, ppm): δ 7.20 (d, 2H, J=3.7 Hz), 7.12 (d, 2H, J=4.7 Hz), 4.40 (br, 4H).

Preparation of 4,7-bis(5-bromothiophen-2-yl)-2λ$^4$δ$^2$-benzo[1,2-c;4,5-c']bis[1,2,5]thiadiazole

[Scheme 14]

4,7-Bis(5-bromo-2-thienyl)-2,1,3-benzothiadiazole-5,6-diamine (550 mg, 1.2 mmol) was dissolved in pyridine (7 mL)

and N-thionylalanine (0.36 g, 2.6 mmol) and TMSCl (0.24 g, 2.2 mmol) were added. The reactants were heated to 60° C. and stirred for 24 hours. After cooling to room temperature, the resulting solution was poured to distilled water and the blue solid was separated by filtering under reduced pressure. The solid was dissolved again in $CH_2Cl_2$ and subjected to column chromatography ($CH_2Cl_2$: hexane=3:1) to obtain pure 4,7-bis(5-bromothiophen-2-yl)-2$\lambda^4\delta^2$-benzo[1,2-c;4,5-c']bis[1,2,5]thiadiazole (450 mg, 0.87 mmol, yield: 72%) as blue solid. $^1$H NMR (400 MHz, N,N-dimethlforamide-$d_7$, ppm): $\delta$ 8.91 (d, J=4.4 Hz, 2H), 7.33 (d, J=4.4 Hz, 2H); UV-vis ($CHCl_3$) $\lambda_{max}$: 735 nm; HRMS calcd. for $C_{18}H_{10}N_4O_4S_4$ ($M^+$): 473.9595. found: 473.9664.

Using the electron donor units and the electron acceptor units, benzobis(thiadiazole), copolymers were prepared by Suzuki coupling or Stille coupling.

Example 1

Preparation of poly[2,6-(4,4-bis(2-ethylhexyl)-4H-cyclopenta[2,1-b;3,4-b']dithiophene)-alt-5,5-(4,8-di-2-thienyl-2$\lambda^4\delta^2$-[1,2-c;4,5-c']bis[1,2,5]thiadiazole)] (PCPBBT)

The cyclopentaditiophene derivative 4,4-bis(2-ethylhexyl)-4H-cyclopenta[2,1-b;3,4-b']dithiophene (0.98 g, 1.0 mmol) prepared in Preparation Example 1 and the benzobis (thiadiazole) derivative 4,7-bis(5-bromothiophen-2-yl)-2$\lambda^4\delta^2$-benzo[1,2-c;4,5-c']bis[1,2,5]thiadiazole (0.51 g, 1.0 mmol) prepared in Preparation Example 3 were dissolved in dry DMF (50 mL) and, after blowing in argon gas, reacted by adding tetrakis(triphenylphosphine)palladium (0.03 g) and triphenylphosphine (0.06 g, 0.02 mmol). After reaction for 3 days by reflux, the resulting solution was dropped on methanol which was being stirred to obtain solid. The solid was filtered, washed with methanol and dried. Then, the solid was dissolved in chlorobenzene and an aqueous solution of sodium diethyldithiocarbamate (6.3 g in 84 mL of water) was added. The resulting mixture was stirred overnight at 80° C. under argon atmosphere. The organic layer was separated and passed through a column packed with alumina, Celite and silica gel by chlorobenzene. The collected polymer solution was concentrated under reduced pressure and poured to methanol. The resulting precipitate was collected, extracted with acetone for 8 hours using a Soxhlet extractor, and dried overnight at room temperature in vacuum to obtain the polymer PCPBBT as brown solid (yield: 61%). $T_g$=119° C.; $^1$H NMR (500 MHz, $CDCl_3$, ppm): $\delta$ 8.99 (br, 2H), 7.76-6.66 (br, 4H), 1.94 (br, 4H), 1.03 (m, 16H), 0.77 (m, 10H), 0.65 (m, 4H); Anal. calcd. for $(C_{39}H_{42})_n$: C, 61.67; H, 5.60. found: C, 61.70; H, 5.58.

Example 2

Preparation of poly[2,7-(9,9-bis(2-ethylhexyl)-fluorene)-alt-5,5-(4,8-di-2-thienyl-2$\lambda^4\delta^2$-[1,2-c;4,5-c']bis[1,2,5]thiadiazole)] (PFTBBT)

A mixture of the fluorene derivative 2,7-bis(4,4,5,5,-tetramethyl[1.3.2]dioxaborolan-2-yl)-9,9-bis(2-ethylhexyl)-fluorene (0.64 g, 1.0 mmol) prepared in Preparation Example 2, the BBT derivative 4,7-bis(5-bromothiophen-2-yl)-2$\lambda^4\delta^2$-benzo[1,2-c;4,5-c']bis[1,2,5]thiadiazole (0.51 g, 1.0 mmol) prepared in Preparation Example 3 and Aliquat 336 (0.04 g) was purged 3 times with argon and dry toluene (10 mL) was added. Then, tetrakis(triphenylphosphine)palladium (0.01 g) and aqueous sodium carbonate solution (2 M, 3.0 mL) were added under argon atmosphere. Then, reflux was performed for 3 days with vigorous stirring. The resulting highly viscous solution was dissolved again in chloroform ($CHCl_3$), washed with water, dried with $Na_2SO_4$, and filtered through Celite. The solution was concentrated and poured to hot methanol to obtain pale yellow polymer. The polymer was collected, extracted with acetone for 8 hours using a Soxhlet extractor, and dried overnight at room temperature in vacuum to obtain the polymer PFTBBT (yield: 55%). $T_g$=100° C.; $M_n$=4,600, $M_w$=11,000, PDI=2.39; $^1$H NMR (500 MHz, $CDCl_3$, ppm): $\delta$ 9.05 (m, 2H), 7.89-7.57 (m, 8H), 2.11 (br, 4H), 1.00-0.76 (m, 18H), 0.75-0.52 (m, 12H); Anal. calcd. for $(C_{43}H_{46})_n$: C, 68.95; H, 6.25. found: C, 69.13; H, 6.21.

Comparative Example 1

Preparation of poly[2,6-(4,4-bis(2-ethylhexyl)-4H-cyclopenta[2,1-b;3,4-b']dithiophene)-alt-4,7-(2,1,3-benzothiadiazole)] (PCPBTD)

PCPBTD

The cyclopentaditiophene derivative 4,4-bis(2-ethylhexyl)-4H-cyclopenta[2,1-b:3,4-b']dithiophene (0.98 g, 1.0 mmol) prepared in Preparation Example 1 and 4,7-2,1,3-benzothiadiazole (0.29 g, 1.0 mmol) were dissolved in toluene (20 mL) and purged with argon. Then, tris(dibenzylideneacetone)dipalladium(0) (0.03 g) and triphenylphosphine (0.06 g, 0.02 mmol) were added. The mixture was refluxed for 3 days under argon atmosphere. After completely removing the solvent by concentration under reduced pressure, the remainder was dissolved in chloroform. The solution was dropped on methanol which was being stirred. The resulting blue precipitate was collected using a Soxhlet thimble, washed with methanol, dried, and extracted with acetone for 12 hours using a Soxhlet extractor. The undissolved residue was dissolved again and precipitated in methanol. After filtering and evaporation, the resulting solid was dried overnight at room temperature in vacuum to obtain the polymer PCPBTD as blue solid (yield: 54%). $T_g$=122° C.; $M_n$=12,000, $M_w$=28,000, PDI=2.32; $^1$H NMR (500 MHz, $CDCl_3$, ppm): $\delta$ 8.14 (s, br, 2H), 7.89 (s, br, 2H), 2.08 (s, br, 4H), 1.04 (m, 16H), 0.88-0.74 (m, 12H), 0.68 (m, 12H); Anal. calcd. for $(C_{31}H_{40})_n$: C, 69.21; H, 7.55. found: C, 69.35; H, 7.51.

Comparative Example 2

Preparation of poly[2,7-(9,9-bis(2-ethylhexyl)-fluorene)-alt-5,5-(4',7'-di-2-thienyl-2',1',3'-benzothiadiazole)] (PFPBTD)

PFTBTD

[Scheme 15]

The BTD derivative 4,7-bis(5-bromo-2-thienyl)-2,1,3-benzothiadiazole was prepared according to Scheme 15.

The intermediate 4,7-dibromo-2,1,3-benzothiadiazole (1.4 g, 4.9 mmol) obtained in Preparation Example 3, tributyl-2-thienylstannane (8.4 g, 18.9 mmol) and $PdCl_2(PPh_3)_2$ were dissolved in anhydrous THF (20 mL) and stirred at 70° C. for 12 hours under nitrogen flow. After extracting with distilled water and dichloromethane, the product was dried with anhydrous $MgSO_4$ and filtered under reduced pressure. 4,7-Di-2-thienyl-2,1,3-benzothiadiazole (1.4 g, yield: 63%) was obtained by recrystallization using ethanol following purification by column chromatography ($CH_2Cl_2$:hexane=1:1). $^1$H NMR (300 MHz, $CDCl_3$, ppm): δ 8.11 (dd, 2H), 7.87 (s, 2H), 7.46 (dd, 2H), 7.21 (dd, 2H).

Subsequently, 4,7-di-2-thienyl-2,1,3-benzothiadiazole (1.28 g, 2.73 mmol) was dissolved in chloroform (25 mL) and acetic acid (25 mL) and N-bromosuccinimide (1.21 g, 6.82 mmol) was added at room temperature. After stirring for a day at room temperature, the resulting reddish brown precipitate was filtered under reduced pressure to remove the reaction solvent. Then, 4,7-bis(5-bromo-2-thienyl)-2,1,3-benzothiadiazole (1.5 g, yield: 88%) was obtained by recrystallization in DMF). $^1$H NMR (300 MHz, $CDCl_3$, ppm): δ 7.81 (dd, 2H, J=4 Hz), 7.78 (s, 2H), 7.15 (dd, 2H, J=4 Hz).

The fluorene derivative 2,7-bis(4,4,5,5-tetramethyl[1.3.2] dioxaborolan-2-yl)-9,9-bis(2-ethylhexyl)-fluorene (0.64 g, 1.0 mmol) and the 4,7-bis(5-bromo-2-thienyl)-2,1,3-benzothiadiazole (0.45 g, 1.0 mmol) prepared above were reacted in the same manner as in Example 2 to obtain polymer with 49% yield. $T_g$=88° C.; $M_n$=30,000, $M_w$=37,000, PDI=1.23; $^1$H NMR (500 MHz, $CDCl_3$, ppm): δ 8.18 (s, br, 2H), 7.94 (s, br, 2H), 7.23 (s, br, 6H), 7.48 (m, 2H), 2.13 (br, 4H), 1.00-0.75 (m, 18H), 0.68 (m, 6H), 0.59 (m, 6H); Anal. calcd. for $(C_{43}H_{48})_n$: C, 74.79; H, 7.21. found: C, 74.95; H, 7.02.

Test Example 1

Optical Characteristics

Figure 1:
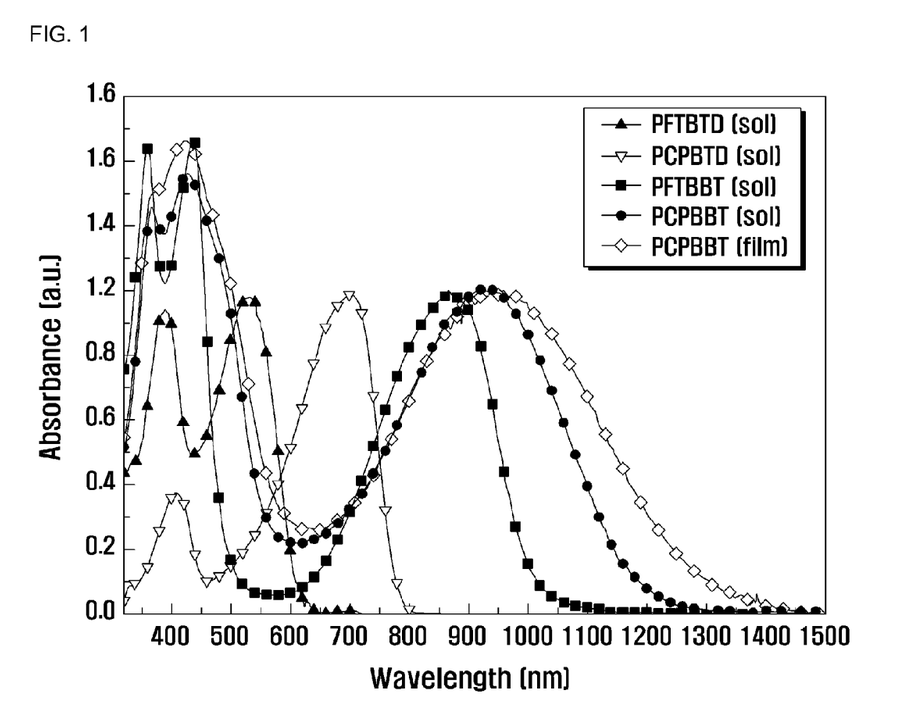
FIG. 1 is compares the optical properties of a benzobis(thiadiazole)-based alternating copolymer according to the present disclosure and a benzothiadiazole-based alternating copolymer as control.

Absorption spectra are shown in FIG. 1 and Table 1.

TABLE 1

|  | $\lambda_{max\_sol}$ (nm) | $\lambda_{max\_film}$ (nm) |
| --- | --- | --- |
| PCPBTD (Comp. Ex. 1) | 407, 702 | 411, 723 |
| PFTBTD (Comp. Ex. 2) | 390, 531 | 398, 539 |
| PCPBBT (Ex. 1) | 428, 926 | 422, 951 |
| PFTBBT (Ex. 2) | 436, 873 | 424, 879 |

$\lambda_{max\_sol}$ was measured in chlorobenzene solution.
$\lambda_{max\_film}$ was measured in thin film on a glass substrate.

Test Example 2

Electrochemical Characteristics

Electrochemical characteristics data are summarized in Table 2.

HOMO, LUMO and energy band gap of the synthesized polymers were determined by cyclic voltammetry.

The oxidation potential of the polymers according to the present disclosure was compared with that of the ferrocene/ferrocenium ($Fc/Fc^+$) binding. HOMO energy level was determined on the assumption that the energy level of $Fc/Fc^+$ is 4.88 eV. Energy band gap was determined from the edge of the $Q_2$ absorption band. Finally, LUMO energy level was determined from the HOMO energy level and the band gap.

TABLE 2

|  | HOMO (eV) | LUMO (eV) | $E_g$ (eV) |
| --- | --- | --- | --- |
| PCPBTD (Comp. Ex. 1) | −5.10 | −3.50 | −1.60 |
| PFTBTD (Comp. Ex. 2) | −5.43 | −3.38 | −2.05 |
| PCPBBT (Ex. 1) | −5.33 | −4.32 | −1.01 |
| PFTBBT (Ex. 2) | −5.12 | −3.92 | −1.20 |

As seen from Table 2, the copolymer including benzobis (thiadiazole) as electron acceptor unit according to the present disclosure exhibits lower LUMO and energy band gap as compared to the copolymer including the benzothiadiazole unit.

Test Example 3

Organic Thin-Film Transistor Device Characteristics

Organic thin-film transistor devices were fabricated using the polymers of Examples 1-2 and Comparative Examples 1-2.

A solution of each polymer in chlorobenzene (5 mg/mL) was spin-cast (500 rpm, 5 s, 2000 rpm, 60 s) on an octadecyltrichlorosilane-treated $n^{++}$-Si/SiO$_2$ (200 nm) substrate. The thickness of the cast polymer layer was 150-300 nm. After the casting, the substrate was baked in a glove box at 90° C. for 20 minutes under nitrogen flow. After the baking, gold source and drain electrodes were deposited by thermal evaporation under high vacuum ($10^{-6}$ torr). The thickness of the source and drain electrodes was 50 nm. The channel length and width were 50 μm and 20 nm, respectively. The transistor device characteristics were measured in a glove box filled with nitrogen.

Hole mobility ($\mu_h$), electron mobility ($\mu_e$) and on/off ratio were measured. The result is given in Table 3.

TABLE 3

|  | $\mu_h$ (cm$^2$/V·s) | $\mu_e$ (cm$^2$/V·s) | $I_{on}/I_{off}$ |
|---|---|---|---|
| PCPBTD (Comp. Ex. 1) | $9.2 \times 10^{-4}$ | — | $7.1 \times 10^3$ |
| PFTBTD (Comp. Ex. 2) | $1.7 \times 10^{-8}$ | — | $<10^3$ |
| PCPBBT (Ex. 1) | $7.1 \times 10^{-4}$ | $3.3 \times 10^{-3}$ | $\sim 10^2$ |
| PFTBBT (Ex. 2) | $3.1 \times 10^{-4}$ | — | $1.5 \times 10^3$ |

As seen from Table 3, the PCPBBT of Example 1 shows ambipolar characteristics with both hole and electron mobility.

Figure 2:
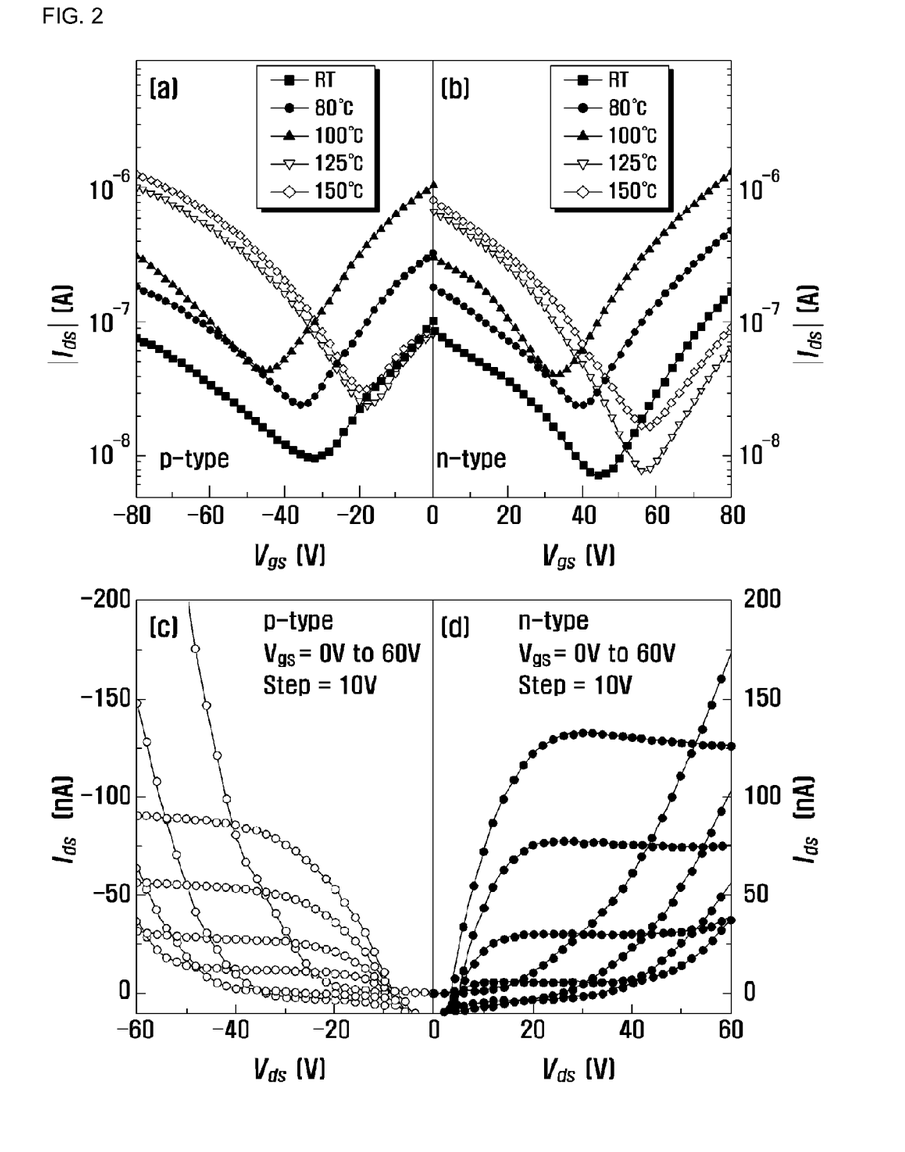
FIG. 2 shows the ambipolar characteristics of PCPBTD, a benzobis(thiadiazole)-based alternating copolymer according to the present disclosure.

FIGS. 2 (a) and (b) show the p-type and n-type semiconductor transfer characteristics in the plots of drain-source current ($I_{ds}$) versus drain-source voltage ($V_{ds}$) measured at various annealing temperatures. FIGS. 2 (c) and (d) show the output characteristics of p-type and n-type devices annealed at 80° C. for 5 minutes.

Figure 3:
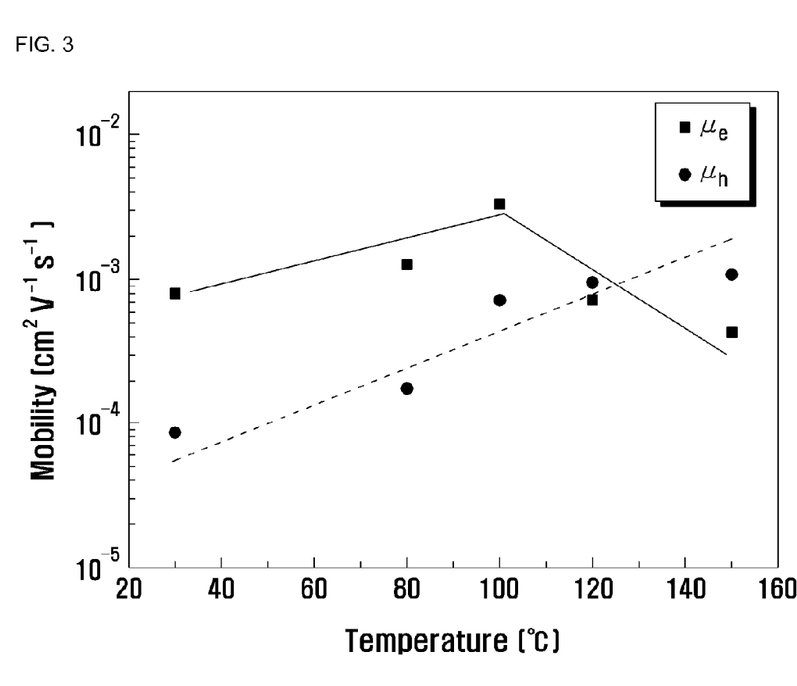
FIG. 3 shows the annealing temperature dependence of hole and electron mobilities of PCPBTD, a benzobis(thiadiazole)-based alternating copolymer according to the present disclosure.

FIG. 3 shows the annealing temperature dependence of hole and electron mobilities of the transistor device fabricated using the polymer of Example 1.

The highest hole mobility was $\mu_h = 7.1 \times 10^{-4}$ cm$^2$/V·s at 120° C. and the highest electron mobility was $\mu_e = 3.3 \times 10^{-3}$ cm$^2$/V·s at 100° C. The observed ambipolar mobility results from the combination of a low LUMO energy and a small band gap attributed to the bisthiadiazole units.

The alternating copolymer including benzobis(thiadiazole) as part of repeat units according to the present disclosure exhibits lower band gas as compared to the existing benzobisdiazole-based alternating copolymers. Especially; an alternating copolymer with cyclopentaditiophene exhibits a very low band gap of 1.01 eV as well as ambipolar characteristics with both hole and electron mobility, making it useful for both p-type and n-type semiconductors.

While the present disclosure has been described with respect to the specific embodiments, it will be apparent to those skilled in the art that various changes and modifications may be made without departing from the spirit and scope of the disclosure as defined in the following claims.

What is claimed is:

1. A benzobis(thiadiazole)-based alternating copolymer represented by the chemical formula 1:

(1)

wherein $R^1$, $R^2$ or $R^3$ is hydrogen or $C_1$-$C_{20}$ linear, branched or cyclic alkyl, X is S, O, NR$^4$, PR$^5$, or HC=CH, wherein R$^4$ or R$^5$ is $C_1$-$C_{20}$ linear, branched or cyclic alkyl, Y is C, Si or N (in this case only one of R$^2$ and R$^3$ exists), and m is an integer from 1 to 3.

2. The benzobis(thiadiazole)-based alternating copolymer according to claim 1, wherein Y is C, X is S or HC=CH, and m is 1.

3. The benzobis(thiadiazole)-based alternating copolymer according to claim 1, wherein the alternating copolymer has a weight-average molecular weight of 1000-100000.

4. The benzobis(thiadiazole)-based alternating copolymer according to claim 1, wherein Y is C, X is S or HC=CH, m is 1, $R^1$ is hydrogen, and $R^2$ and $R^3$ are 2-ethylhexyl.

5. The benzobis(thiadiazole)-based alternating copolymer according to claim 1, wherein Y is C, X is HC=CH, m is 1, $R^1$ is hydrogen, and $R^2$ and $R^3$ are 2-ethylhexyl.

6. An organic electronic device comprising a benzobis(thiadiazole)-based alternating copolymer represented by the chemical formula 1:

(1)

wherein $R^1$, $R^2$ or $R^3$ is hydrogen or $C_1$-$C_{20}$ linear, branched or cyclic alkyl, X is S, O, NR$^4$, PR$^5$, or HC=CH, wherein R$^4$ or R$^5$ is $C_1$-$C_{20}$ linear, branched or cyclic alkyl, Y is C, Si or N (in this case only one of R$^2$ and R$^3$ exists), and m is an integer from 1 to 3.

7. The organic electronic device according to claim 6, wherein Y is C, X is S or HC=CH, and m is 1.

8. The organic electronic device according to claim 6, wherein the alternating copolymer has a weight-average molecular weight of 1000-100000.

9. The organic electronic device according to claim 6, wherein Y is C, X is S or HC=CH, m is 1, $R^1$ is hydrogen, and $R^2$ and $R^3$ are 2-ethylhexyl.

10. The organic electronic device according to claim 6, wherein Y is C, X is HC=CH, m is 1, $R^1$ is hydrogen, and $R^2$ and $R^3$ are 2-ethylhexyl.

11. An organic thin-film transistor comprising a benzobis(thiadiazole)-based alternating copolymer represented by the chemical formula 1:

(1)

wherein $R^1$, $R^2$ or $R^3$ is hydrogen or $C_1$-$C_{20}$ linear, branched or cyclic alkyl, X is S, O, NR$^4$, PR$^5$, or HC=CH, wherein R$^4$ or R$^5$ is $C_1$-$C_{20}$ linear, branched or cyclic alkyl, Y is C, Si or N (in this case only one of R$^2$ and R$^3$ exists), and m is an integer from 1 to 3.

12. The organic thin-film transistor according to claim 11, wherein Y is C, X is S or HC=CH, and m is 1.

13. The organic thin-film transistor according to claim 11, wherein the alternating copolymer has a weight-average molecular weight of 1000-100000.

14. The organic thin-film transistor according to claim 11, wherein Y is C, X is S or HC=CH, m is 1, $R^1$ is hydrogen, and $R^2$ and $R^3$ are 2-ethylhexyl.

15. The organic thin-film transistor according to claim 11, wherein Y is C, X is HC=CH, m is 1, $R^1$ is hydrogen, and $R^2$ and $R^3$ are 2-ethylhexyl.

\* \* \* \* \*

UNITED STATES PATENT AND TRADEMARK OFFICE
CERTIFICATE OF CORRECTION

PATENT NO. : 8,519,087 B2
APPLICATION NO. : 13/295434
DATED : August 27, 2013
INVENTOR(S) : Park et al.

Page 1 of 1

It is certified that error appears in the above-identified patent and that said Letters Patent is hereby corrected as shown below:

On the Title page,
Item [73] Assignees: "Hannam University Institute-Academia Corporation" should read --Hannam University Institute for Industry-Academia Corporation--.

Signed and Sealed this
Tenth Day of December, 2013

Margaret A. Focarino
*Commissioner for Patents of the United States Patent and Trademark Office*